(12) United States Patent
Park et al.

(10) Patent No.: US 10,734,471 B2
(45) Date of Patent: Aug. 4, 2020

(54) ORGANIC LIGHT EMITTING DISPLAY DEVICE WITH SECOND METAL LAYER CONTACTING FIRST METAL LAYER AT POWER SUPPLY LINE

(71) Applicant: LG Display Co., Ltd., Seoul (KR)

(72) Inventors: JongChan Park, Paju-si (KR); JinHwan Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 25 days.

(21) Appl. No.: 15/797,460

(22) Filed: Oct. 30, 2017

(65) Prior Publication Data

US 2018/0122890 A1   May 3, 2018

(30) Foreign Application Priority Data

Oct. 31, 2016   (KR) .......................... 10-2016-0143699

(51) Int. Cl.
*H01L 27/32*   (2006.01)
*H01L 51/52*   (2006.01)
*H01L 51/00*   (2006.01)

(52) U.S. Cl.
CPC ...... *H01L 27/3279* (2013.01); *H01L 27/3248* (2013.01); *H01L 27/3258* (2013.01); *H01L 27/3276* (2013.01); *H01L 51/0097* (2013.01); *H01L 51/5246* (2013.01); *H01L 51/5253* (2013.01); *H01L 51/5268* (2013.01); *H01L 2251/5338* (2013.01)

(58) Field of Classification Search
CPC ............. H01L 27/3279; H01L 27/3276; H01L 27/3297
USPC ..................................................... 257/40, 88
See application file for complete search history.

(56) References Cited

U.S. PATENT DOCUMENTS

| | | | | |
|---|---|---|---|---|
| 2002/0180371 | A1* | 12/2002 | Yamazaki | H01L 27/3246 315/169.3 |
| 2009/0058280 | A1* | 3/2009 | Jo | H01L 27/3246 313/504 |
| 2012/0256973 | A1* | 10/2012 | Choi | H01L 51/5253 345/690 |

* cited by examiner

*Primary Examiner* — Robert T Huber
(74) *Attorney, Agent, or Firm* — Polsinelli PC

(57) ABSTRACT

The present disclosure discloses an organic light emitting display device having a substrate including an active area configured to display an image and an inactive area configured to surround the active area; a power supply line in the inactive area; a first planarization layer on a layer where the power supply line is disposed on; a first metal layer on the first planarization layer and in contact with the power supply line; a second planarization layer configured to planarize an upper portion of the first metal layer; and a second metal layer, on the second planarization layer, and in contact with the first metal layer and a cathode of an organic light emitting diode, so that an improved arrangement of signals lines in the inactive area where conductive lines are efficiently arranged in a limited space at an edge portion of the substrate in order to realize a narrow bezel configuration and have a signal line structure capable of supplying stable power to various components.

12 Claims, 6 Drawing Sheets

ORGANIC LIGHT EMITTING DISPLAY DEVICE WITH SECOND METAL LAYER CONTACTING FIRST METAL LAYER AT POWER SUPPLY LINE

CROSS REFERENCE TO RELATED APPLICATION

This application claims the benefit of the Korean Patent Application No. 10-2016-0143699 filed on Oct. 31, 2016, which is hereby incorporated by reference in its entirety as if fully set forth herein.

BACKGROUND

Field of the Disclosure

The present disclosure relates to a display device, and more particularly, to an organic light emitting display device.

Description of the Background

Image display device that realizes information on the screen is being developed to be thinner, lighter, and more portable and to have higher performance. Therefore, an organic light emitting display device for displaying an image by controlling the amount of light emitted from the organic light emitting device is gaining popularity.

The organic light emitting device is advantageous in that it can be made thin, due to its self-luminous characteristics using a thin light emitting layer between electrodes. A typical organic light emitting display device has a structure in which a pixel driving circuit and an organic light emitting element are formed on a substrate, and light emitted from the organic light emitting element passes through the substrate or the barrier layer to display an image.

Since the organic light emitting display device is implemented without a separate light source, it can be readily implemented as a flexible display device. A flexible material such as plastic or metal foil can be used as a substrate of an organic light emitting display device.

As the size and high resolution of the organic light emitting display device have been advanced in recent years, the required number of signal lines has increased, but the space for arranging a greater number of signal lines has become insufficient. Thus, it is an important task to secure sufficient space for accommodating various elements and their electric wiring. Furthermore, a method of efficiently arranging various parts and elements is being studied.

SUMMARY

An aspect of the present disclosure is to provide an organic light emitting display device and a signal line arrangement structure applied to the organic light emitting display device.

It should be noted that other aspects of the present disclosure are not limited to the above and additional aspects of the present disclosure will be apparent to those skilled in the art from the following descriptions.

The organic light emitting display device may include a substrate including an active area configured to display an image and an inactive area configured to surround the active area, a power supply line in the inactive area, a first planarization layer on a layer where the power supply line is disposed on, a first metal layer on the first planarization layer and in contact with the power supply line, a second planarization layer configured to planarize an upper portion of the first metal layer, and a second metal layer, on the second planarization layer, and in contact with the first metal layer and a cathode of an organic light emitting diode. The details of other aspects are included in the detailed description and accompanying drawings.

According to the aspects of the present disclosure, there is provided an organic light emitting display with improved arrangement of signals lines in an inactive area. More specifically, the aspects of the present disclosure can provide an organic light emitting display in which conductive lines are efficiently arranged in a limited space at an edge portion of the substrate. Accordingly, the organic light emitting display device according to the aspects of the present disclosure can realize a narrow bezel configuration. Furthermore, the aspects of the present disclosure can provide an organic light emitting display having a signal line structure capable of supplying stable power to various components.

It should be noted that the effects of the present disclosure are not limited to those described above and other effects of the present disclosure are included in the following descriptions.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
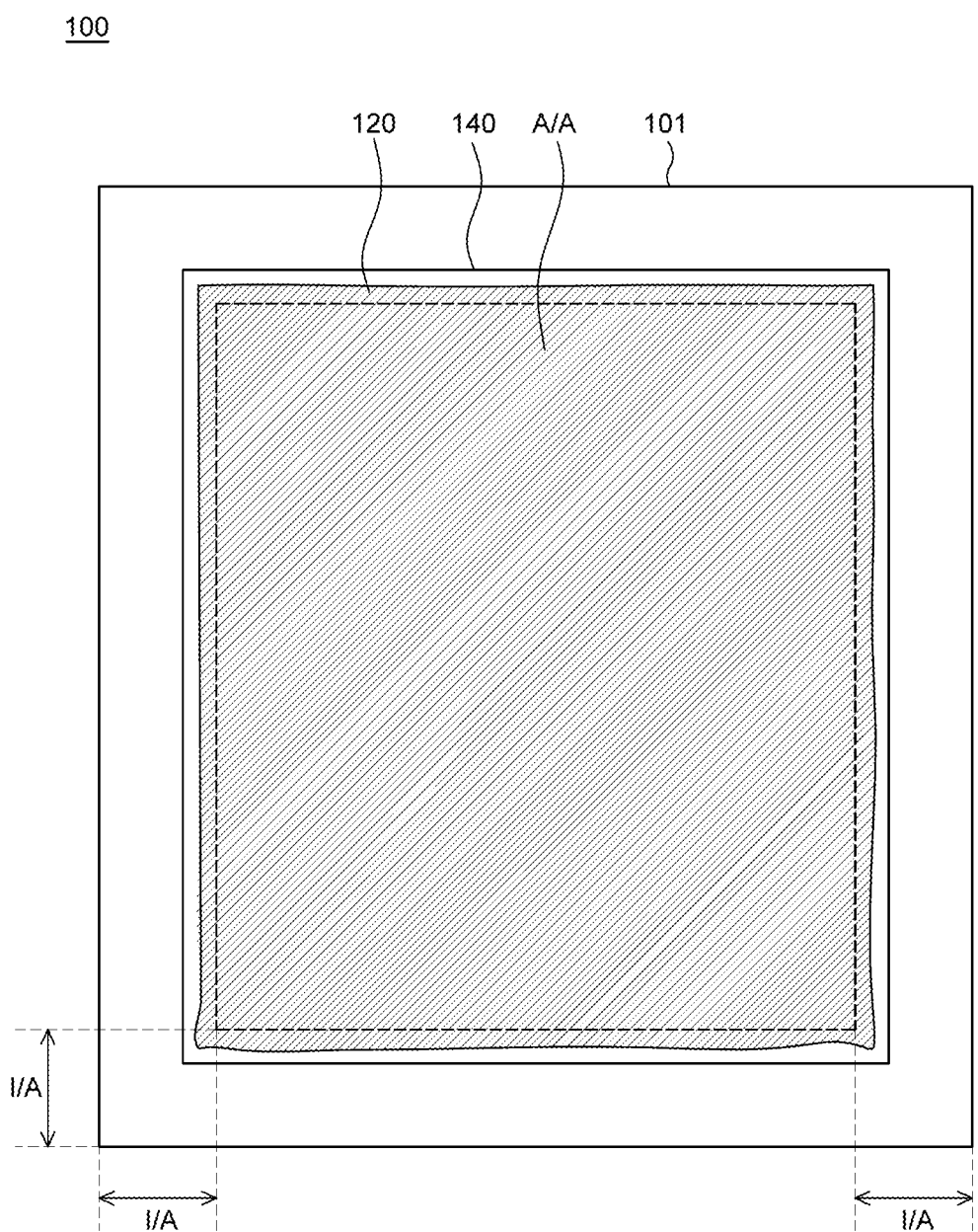
FIG. 1 is a plan view of an organic light emitting display according to an aspect of the present disclosure.

Advantages and characteristics of the present disclosure and methods for accomplishing the same will be more clearly understood from the aspects described below with reference to the accompanying drawings. However, the present disclosure is not limited to the aspects but may be implemented in various different forms. The aspects are provided only to complete disclosure of the present disclosure and to fully provide a person having ordinary skill in the art to which the present disclosure pertains and the present disclosure will be defined by the appended claims.

The shapes, sizes, ratios, angles, numbers and the like illustrated in the accompanying drawings for describing the various aspects of the present disclosure are merely examples and the present disclosure is not limited thereto. Like reference numerals generally denote like elements throughout the present specification. Further, in the following description, a detailed explanation of known related technologies may be omitted to avoid unnecessarily obscuring the subject matter of the present disclosure. The terms such as "including", "having" and "comprising" used herein are generally intended to allow other components to be added unless the terms are used with the term "only". Any references to singular may include plural unless expressly stated otherwise. Components are interpreted to include an ordinary error range or an ordinary tolerance range even if not expressly stated.

When the positional relationship between two parts is described using the terms such as "on", "above", "below" and "next", on or more parts may be positioned between the two parts unless the terms are used with the term "immediately" or "directly". When an element or layer is referred to as being "on" another element or layer, it may be directly on the other element or layer, or intervening elements or layers may be present. It should be understood when an element is described as being "connected", "coupled", or "connected" to another element, the element may be directly connected or connected to the other element, but also it can be interpreted that another element may be "interposed" therebetween, or each element may be "connected", "coupled", or "contacted" through another element.

Although the terms "first", "second" and the like are used for describing various components, these components are not confined by these terms. These terms are merely used for distinguishing one component from the other components. Therefore, a first component to be mentioned below may be a second component with respect to the technical concepts of the present disclosure.

Since the size and thickness of each component illustrated in the drawings are represented for the convenience of explanation, the present disclosure is not necessarily limited to the illustrated size and thickness of each component. Various aspects of the present disclosure will be described in detail with reference to the accompanying drawings.

FIG. 1 is a plan view of an organic light emitting display according to an aspect of the present disclosure.

Referring to FIG. 1, an organic light emitting display device 100 includes at least an active area A/A having an array of pixels disposed therein. At least an inactive area I/A may be formed around the active area. That is, the inactive area may be adjacent to one or more side of the active area. In FIG. 1, the inactive area surrounds an active area having a rectangular shape. However, the shape of the active area and the shape and the arrangement of the inactive area adjacent to the active area are not limited to the flexible display as illustrated in FIG. 1. The active area and the inactive area may be formed to be suitable for designing an electronic device on which the display device 100 is implemented. Non-limiting examples of the active area shapes is pentagonal, hexagonal, circular, oval, and the like.

Each pixel in the active area A/A may be associated with a pixel driving circuit. The pixel driving circuit may include at least one switching transistor and at least one driving transistor. Each pixel driving circuit may be electrically connected to a signal line (e.g., a gate line, a data line, and the like) for sending and receiving signals with a gate driver, a data driver, and the like positioned in the inactive area.

The gate driver and the data driver may be implemented with a thin film transistor (TFT) in the inactive area I/A. These drivers may be referred to as gate-in-panel (GIP) due to its implementation in the panel itself. In addition, some components, such as a data driver integrated circuit (IC), may be mounted on a separate printed circuit board, and it may be coupled with a connection interface (e.g., pad, bump, pin, and the like) disposed in the inactive area through a circuit film such as flexible printed circuit board (FPCB), chip-on-film (COF) or tape-carrier-package (TCP). The printed circuit (COF, PCB, etc.) may be located behind the display device 100.

The organic light emitting display device 100 may include various additional elements for generating various signals or driving pixels in the active area. Additional elements for driving the pixel may include an inverter circuit, a multiplexer, an electrostatic discharge (ESD) circuit, and the like. The organic light emitting display device 100 may also include additional elements associated with functions other than pixel driving. For example, the organic light emitting display device 100 may include additional elements for providing a touch sensing function, a user authentication function (e.g., fingerprint scanning), a multi-level pressure sensing function, a tactile feedback function and the like. The above-mentioned additional elements may be located in the inactive area and/or an external circuit connected to the connection interface.

The organic light emitting display device according to the present disclosure may include a substrate 101 on which a thin film transistor and an organic light emitting diode are arranged, an encapsulation layer 120, a barrier film 140, and the like.

The substrate 101 supports various elements of the organic light emitting display device 100. The substrate 101 may be formed of a transparent insulating material, for example, glass, plastic, or the like. The substrate (i.e., array substrate) may also include an element and a functional layer formed thereon, for example, a switching TFT, a driving TFT connected to the switching TFT, an organic light emitting element connected to the driving TFT, a passivation layer or the like.

The organic light emitting element is disposed on the substrate 101. The organic light emitting element includes an anode, an organic light emitting layer, and a cathode. The organic light emitting element may have a single light emitting layer structure to emit a single color light (such as red, green or blue) or may include a plurality of light emitting layers to emit white light. When the organic light emitting element emits white light, a color filter or color refiner may further be provided. The organic light emitting element may be formed in the central portion of the substrate 101 to correspond to the active area.

The encapsulation layer 120 may cover the organic light emitting element. The encapsulation layer protects the organic light emitting device from external moisture or oxygen. A barrier film may be disposed on the encapsulation layer.

The organic light emitting display device 100 includes a plurality of pixels, and each pixel may include a plurality of sub-pixels. At this time, the sub-pixel may be considered to be the minimum unit for expressing one color.

One sub-pixel may include a plurality of transistors, a capacitor, and a plurality of signal lines. The sub-pixel may be composed of two transistors and one capacitor (i.e., 2T1C), but it is not limited thereto and may be implemented as a sub-pixel realized with a structure such as 4T1C, 7T1C, 6T2C, and the like. In addition, the sub-pixel may be implemented to be suitable for the organic light emitting display device 100 of the top emission type.

Figure 2:
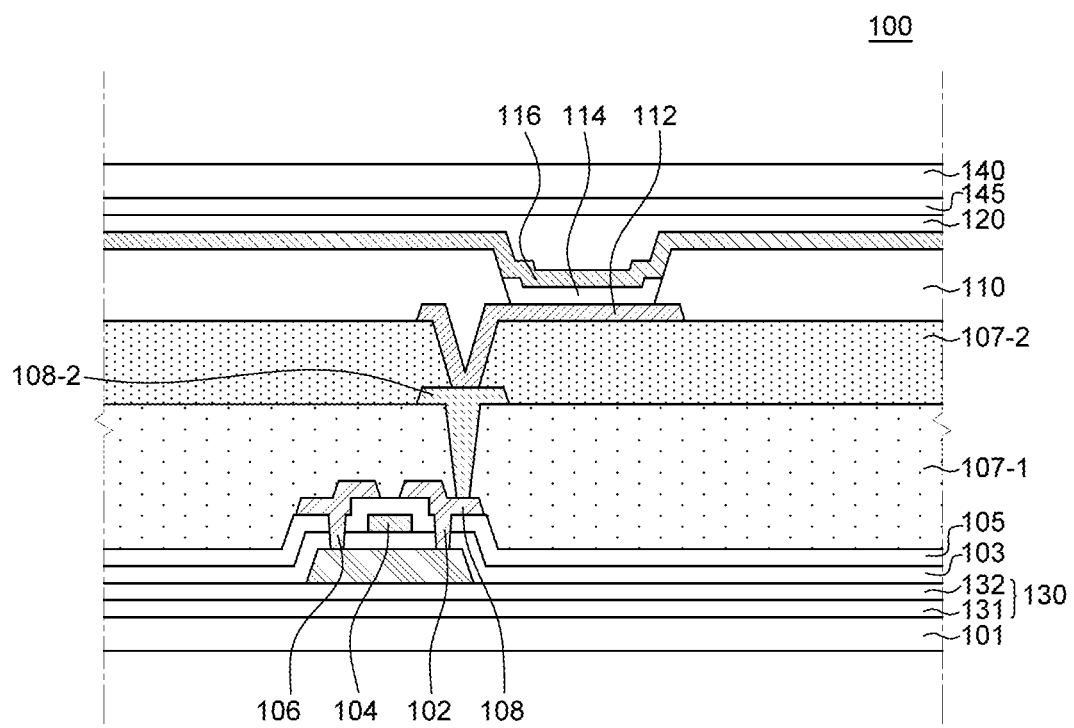
FIG. 2 is a cross-sectional view illustrating a portion of an active area of an organic light emitting display device according to an aspect of the present disclosure.

FIG. 2 is a cross-sectional view illustrating a portion of an active area of an organic light emitting display device according to an aspect of the present disclosure.

The organic light emitting display device of FIG. 2 has an exemplary structure in which two planarization layers are formed. In the organic light emitting display device 100, thin film transistor elements 102, 104, 106 and 108, organic light emitting elements 112, 114 and 116 and various functional layers are disposed on the substrate (or an array substrate).

The substrate 101 may be a glass or plastic substrate. In the case of a plastic substrate, a polyimide-based material or a polycarbonate-based material may be used to have flexibility. In particular, polyimide can be processed under a high-temperature and is a material that can be coated, and thus is widely used as a plastic substrate.

The buffer layer 130 is a functional layer for protecting the electrode and signal lines from impurities such as alkali ions or the like came out from the substrate 101 or the lower layers. The buffer layer may be formed of silicon oxide (SiOx), silicon nitride (SiNx), or a multilayer thereof. The buffer layer 130 may include a multi-buffer 131 and/or an active buffer 132. The multi-buffer 131 may be formed by alternately stacking silicon nitride (SiNx) and silicon oxide (SiOx), and may prevent or delay diffusion of moisture and/or oxygen permeated into the substrate 101. The active buffer 132 protects the semiconductor layer 102 of the transistor and functions to block various kinds of defects introduced from the substrate 101. The active buffer 132 may be formed of amorphous silicon (a-Si) or the like.

The thin film transistor may be in the form in which the semiconductor layer 102, the gate insulating layer 103, the gate electrode 104, the interlayer insulating layer 105, and the source and drain electrodes 106 and 108 are sequentially stacked. The semiconductor layer 102 is located on the buffer layer 130. The semiconductor layer 102 may be made of polysilicon (p-Si), and in such case, a predetermined region may be doped with an impurity. In addition, the semiconductor layer 102 may be made of amorphous silicon (a-Si), or may be made of various organic semiconductor materials such as pentacene. Further, the semiconductor layer 102 may be made of an oxide material. The gate insulating layer 103 may be formed of an insulating inorganic material such as silicon oxide (SiOx) or silicon nitride (SiNx), or may be formed of an insulating organic material or the like. The gate electrode 104 may be formed of various conductive materials such as copper (Cu), magnesium (Mg), aluminum (Al), nickel (Ni), chrome (Cr), molybdenum (Mo), tungsten (W) or the like.

The interlayer insulating layer 105 may be formed of an insulating material such as silicon oxide (SiOx) or silicon nitride (SiNx), or may be formed of an insulating organic material or the like. A contact hole may be formed by selectively removing portions of the interlayer insulating film 105 and the gate insulating film 103 so as to expose the source and drain regions.

The source and drain electrodes 106 and 108 are formed on the interlayer insulating layer 105 in the form of a single layer or a multi-layered structure with an electrode material. A passivation layer composed of an inorganic insulating material may cover the source and drain electrodes 106 and 108.

The first planarization layer 107-1 may be on the thin film transistor. The first planarization layer 107-1 protects the thin film transistor and the like and flattens the upper portion thereof. The first planarization layer 107-1 may be formed in various shapes and may be formed of at least one among various materials such as acrylic resin, epoxy resin, phenol resin, polyamide resin, polyimide resin, unsaturated polyester resin, polyphenylene resin, and polyphenylene sulfide resin, but are not limited thereto.

On the first planarization layer 107-1, various metal layers functions as signal lines and electrodes may be disposed.

The second planarization layer 107-2 is on the first planarization layer 107-1. In this aspect, two planarization layers are implemented due to the number of various signal lines are increased as the display device evolves to achieve higher resolution. Therefore, it is difficult to arrange all the signal lines in a single layer while ensuring the minimum gap between the signal lines, thus, an additional layer is required. This extra layer (i.e., second planarization layer) provides sufficient room for signal line arrangement, which makes it easier to design the signal lines/electrodes arrangement. Further, a dielectric material may be used for the planarization layers 107-1 and 107-2, thereby forming capacitances between the planarization layers 107-1 and 107-2 and the metal layers.

The organic light emitting element may have a structure in which the first electrode 112, the organic light emitting layer 114, and the second electrode 116 are sequentially stacked. That is, the organic light emitting element may be configured as a first electrode 112 formed on the planarization layer 107, an organic light emitting layer 114 disposed on the first electrode 112, and a second electrode 116 disposed on the organic light emitting layer 114.

The first electrode 112 may be electrically connected to the drain electrode 108D of the driving thin film transistor through the connection electrode 108-2. When the organic light emitting display device 100 is a top emission type, the first electrode 112 may be made of an opaque conductive material having high reflectivity. For example, the first electrode 112 may be formed of silver (Ag), aluminum (Al), gold (Au), molybdenum (Mo), tungsten (W), chromium (Cr) or alloy thereof. The connection electrode 108-2 may be made of the same material as the source and drain electrodes 106 and 108.

The bank 110 is formed in the region except for the light emitting region. Accordingly, the bank 110 has a bank opening for exposing the first electrode 112 corresponding to the light emitting region. The bank 110 may be made of an inorganic insulating material such as a silicon nitride (SiNx), a silicon oxide (SiOx), or an organic insulating material such as BCB, acrylic resin or imide resin.

The organic light emitting layer 114 is disposed on the first electrode 112 which is exposed by the bank 110. The organic light emitting layer 114 may include a light emitting layer, an electron injection layer, an electron transport layer, a hole transport layer, a hole injection layer, and the like. One or more of these layers may be combined into a single layer. Alternatively, one or more functionalities may be combined into a particular layer.

The second electrode 116 is disposed on the organic light emitting layer 114. When the organic light emitting display device 100 is a top emission type, the second electrode 116 may be a transparent conductive layer such as indium tin oxide (ITO) or indium zinc oxide (IZO), thereby emitting the light generated in the organic light emitting layer 114 to the upper portion of the second electrode 116.

The encapsulation layer 120 is on the second electrode 116. The encapsulation layer 120 provides protection from oxygen and moisture penetration in order to prevent oxidation of the light emitting element and the electrode material. When the organic light emitting element is exposed to moisture or oxygen, a pixel shrinkage phenomenon in which a light emitting region is reduced or dark spots in a light emitting region may occur. The encapsulation layer may be composed of an inorganic film made of glass, metal, aluminum oxide (AlOx) or silicon (Si) based material, or alternatively, an organic film and an inorganic film may be alternately laminated. The inorganic film serves to block permeation of moisture and oxygen, and the organic film serves to planarize the surface of the inorganic film. The reason why the encapsulation layer may be formed of a multiple layers is that it makes the permeation path of moisture and oxygen longer and more complicated than a single layer so as to make permeation of moisture and oxygen into the organic light emitting element more difficult.

The barrier film 140 is disposed on the encapsulation layer 120 to encapsulate the entire substrate 101 including the organic light emitting element. The barrier film 140 may be a phase difference film or an optically isotropic film. When the barrier film has optically isotropic characteristics, the light incident on the barrier film is transmitted as it is without phase delay. Further, an organic film or an inorganic film may be further disposed on the upper or lower surface of the barrier film. The organic film or the inorganic film formed on the upper or lower surface of the barrier film serves to protect permeation of moisture or oxygen.

The adhesive layer 145 may be positioned between the barrier film 140 and the encapsulation layer 120. The adhesive layer 145 bonds the encapsulation layer 120 and the barrier film 140. The adhesive layer 145 may be a thermosetting or natural curing adhesive. For example, the adhesive layer 145 may be made of a material such as B-PSA (Barrier pressure sensitive adhesive). On the barrier film 140, a touch panel (e.g., touch film), a polarizing film, a top cover, and the like may be further disposed.

Figure 3:
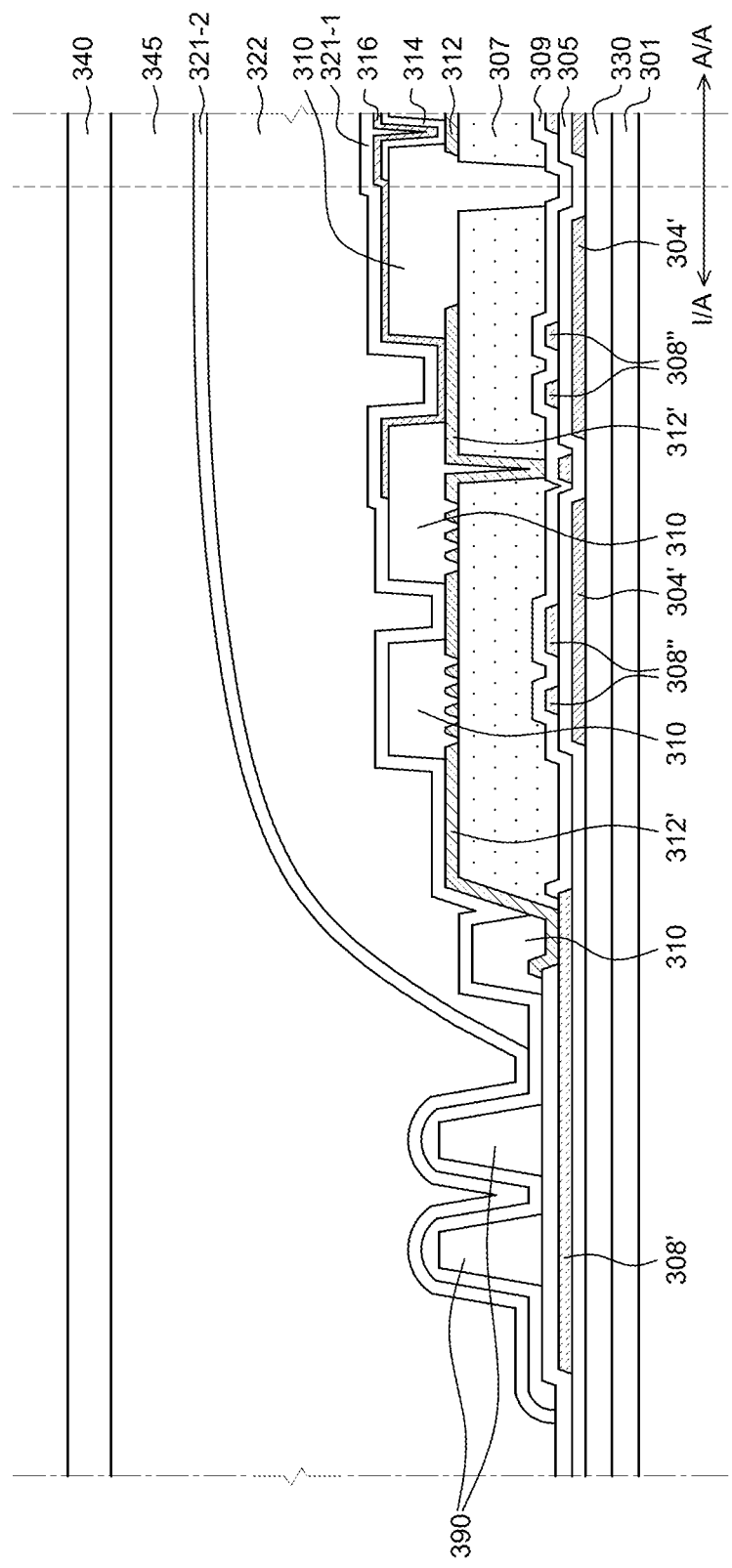
FIG. 3 is a cross-sectional view illustrating a portion of an inactive area of an organic light emitting display according to the related art.

FIG. 3 is a cross-sectional view illustrating a portion of an inactive area of an organic light emitting display according to the related art.

The inactive area I/A may be located outside the active area A/A as illustrated, and a circuit unit (e.g., GIP), power supply line, or the like may be disposed thereon.

The substrate 301 as illustrated in FIG. 3 may be the same substrate as the substrate 101 illustrated in FIG. 1 and FIG. 2. Further, the interlayer insulating layer 305, the buffer layer 330, the bank 310 and the organic light emitting elements 312, 314 and 316 may be the same as the interlayer insulating layer 105, the buffer layer 130, the bank 110 and the organic light emitting elements 112, 114, and 116, as illustrated in FIG. 1 and FIG. 2, respectively.

On the other hand, the inorganic layer 321-1, the organic layer 322 and the inorganic layer 321-2 are examples of the encapsulation layer 120 as illustrated in FIG. 2. The passivation layer 309 may be an insulating layer covering the signal line 308-1 disposed in the inactive area. The dam 390 is a structure for controlling the spreading of the organic layer 322 in the inactive area I/A.

Various circuits, electrodes and signal lines disposed in the inactive area can be made of the gate metal 304' and/or the source/drain metal 308'. The gate metal 304' is formed in the same process as the gate electrode of the TFT, and the source/drain metal 308' is formed in the same process with the same material as the source/drain electrode of the TFT.

As illustrated in FIG. 3, the source/drain metal 308' may be used as a power supply line (e.g., ground voltage (Vss)). The power supply line 308' is connected to the metal layer 312' and the cathode 316 may receive voltage through the connection with the source/drain metal 308' and the metal layer 312'. The metal layer 312' may contact the power supply line and may extend along the sidewall of the outermost planarization layer 307 to contact the cathode 316 on the planarization layer 307. The metal layer 312' may be formed of the same material as the anode 312 of the organic light emitting diode and formed in the same process.

The typical organic light emitting display device has a planarization layer 307 as a single layer in the active area A/A and/or the inactive area I/A. In such a single planarization layer structure, a circuit portion (e.g., GIP) and a power supply line (e.g., Vss) are arranged on the same layer on a bezel. That is, the driving circuits 304' and 308" and the power supply line 308' are disposed on the same layer (e.g., the buffer layer 305) as illustrated in FIG. 3. In particular, since the power supply line needs to have a certain area (or a width) in order to reduce the line resistance, thus, such arrangement occupies a considerably wide width, which limits the implementation of a narrow bezel.

Figure 4:
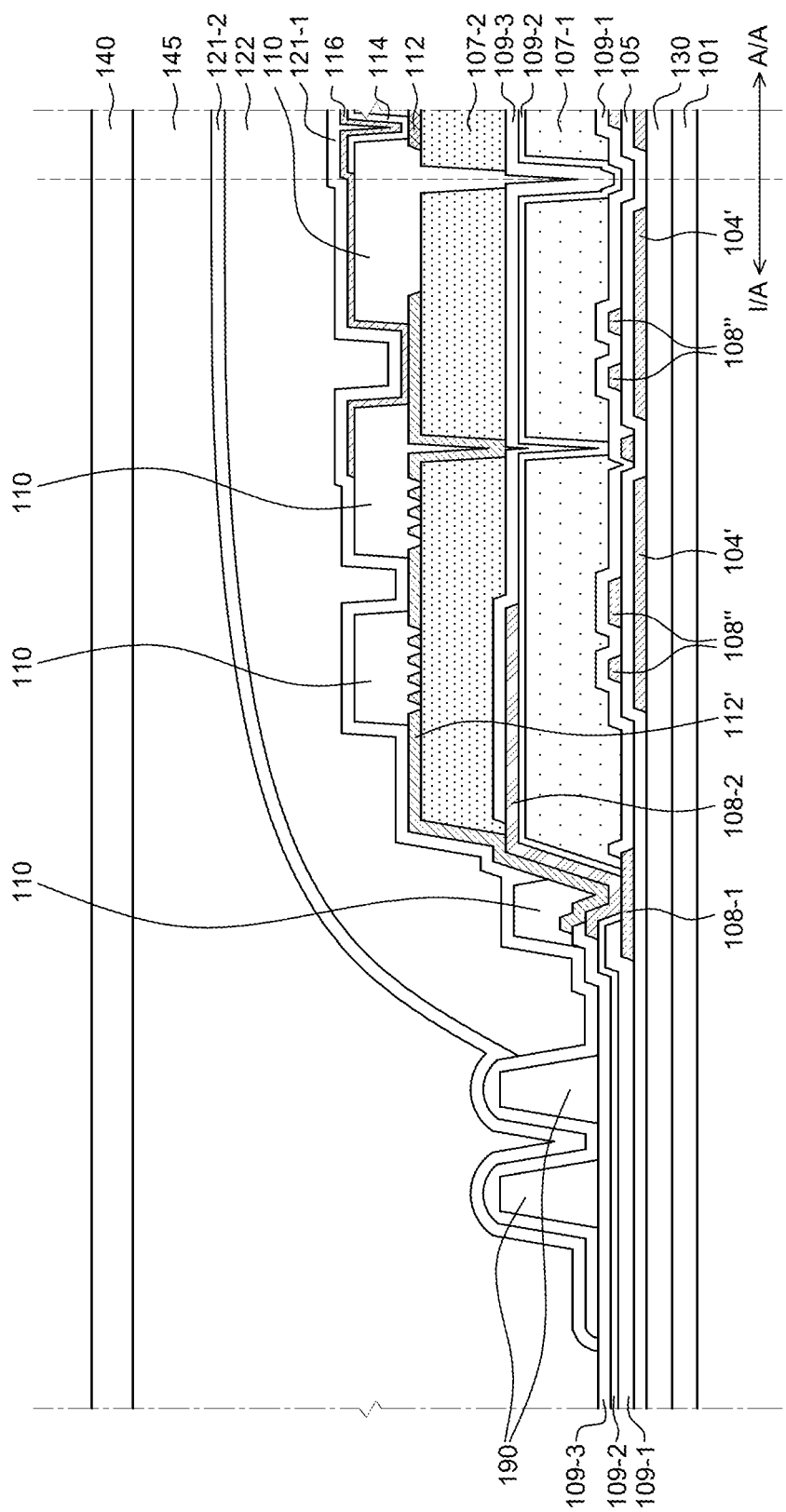
FIG. 4 is a view illustrating a portion of an inactive area of an organic light emitting display device according to an aspect of the present disclosure.

FIG. 4 is a view illustrating a portion of an inactive area of an organic light emitting display device according to an aspect of the present disclosure.

In the organic light emitting display device as illustrated in FIG. 4, a signal line arrangement structure for implementing a narrow bezel is applied. Referring to FIG. 4, substantially the same elements as illustrated in FIG. 1 and FIG. 2 are denoted by the same reference numerals, and redundant descriptions thereof will be omitted.

The inactive area I/A may be located outside the active area A/A as illustrated, and a circuit portion (e.g., GIP), power supply line, or the like may be disposed thereon. In the illustrated aspect, a planarization layer is provided with two layers 107-1 and 107-2. This is to accommodate the increased signal lines with respect to the high resolution screen as described above.

The first planarization layer 107-1 flattens (or planarizes) the upper portion of various circuit elements (e.g., thin film transistors, capacitors, conductors, and the like) on the substrate. A passivation layer 109-1 made of an inorganic material may be disposed between the first planarization layer 107-1 and the circuit element. Various functional metal layers 108-2 may be disposed on the first planarization layer 107-1. At this time, inorganic layers 109-2 and 109-3 for arranging the metal layers 108-2 may be provided on the first planarization layer 107-1. For example, the inorganic layer includes a buffer layer 109-2 and a passivation layer 109-3. The metal layer 108-2 may be disposed over the buffer layer 109-2 and covered with a passivation layer 109-3. The metal layer 108-2 may be a metal formed in the same process as the source and drain electrodes 106 and 108 of the thin film transistor.

The second planarization layer 107-2 is provided on the first planarization layer 107-1. The organic light emitting elements 112, 114 and 116 may be disposed on the second planarization layer 107-2. At this time, the metal layers 112 and 112' connected to the organic light emitting element may be disposed on the second planarization layer 107-2. The metal layer 112' may be formed of a metal made of the same material as the anode 112. At this time, the metal layer 112' may have an opening(s) for out-gassing of any gas generated in the second planarization layer 107-2.

Hereinafter, for convenience of description, the metal layer 108-2 on the first planarization layer 107-1 is referred to as a first metal layer and a metal layer 112' on the second planarization layer 107-2 is referred to as a second metal layer. The first metal layer 108-2 and the second metal layer 112' in the inactive area I/A may configure a structure connecting the power supply line 108-1 and the cathode 116.

The power supply line 108-1 is disposed outside the first planarization layer 107-1 and the first metal layer 108-2 contacts the power supply line 108-1 at the outside the first planarization layer 107-1 and may extend along (or cover) the outermost sidewall of the first planarization layer 107-1. At this time, the first metal layer 108-2 may have a line width less than or equal to the width of the power supply line as described in the structure of the related art as shown in FIG. 3 for the purpose of controlling the resistance. That is, the first metal layer 108-2 has a specific width so as to have a resistance lower than the structure of the related art when connected to the power supply line. Therefore, the power supply line 108-1 can be implemented with a width smaller than that of the related art, so that the inactive area becomes smaller. The reason for the presence of the metal layer connected to the power supply line on the first planarization layer 107-1 may be regarded as that the power supply line disposed on the side of the circuit portions 104' and 108' is rearranged to the upper portion of the circuit portions 104' and 108'. Thus, the above structure can reduce the width of the bezel. Also, under the same bezel width condition, the above structure can ensure more areas than the related art.

On the other hand, the second metal layer 112' contacts the first metal layer 108-1 and extends inward (i.e., toward the active area) to contact the cathode 116 of the organic light emitting diode. Thus, the cathode 116 can receive voltage through connection with the second metal layer 112'. The second metal layer 112' contacts the first metal layer 108-1 at a certain point, that is, at a point where the power supply line 108-1 and the first metal layer 108-1 meet. Further, the second metal layer 112' may extend over the upper surface of the first metal layer 108-1 and the outermost sidewall of the second planarization layer 107-2 and may contact the cathode 116 at an upper portion of the second planarization layer 107-2. The second metal layer 112' may be formed of the same material as the anode 112 of the organic light emitting diode which is formed in the same process.

As illustrated in FIG. 4, it is advantageous that the signal line layout structure using the two planarization layers can reduce the width of the inactive area (e.g., bezel) or allow a margin for scribing in the periphery of the display device.

Figure 5A:
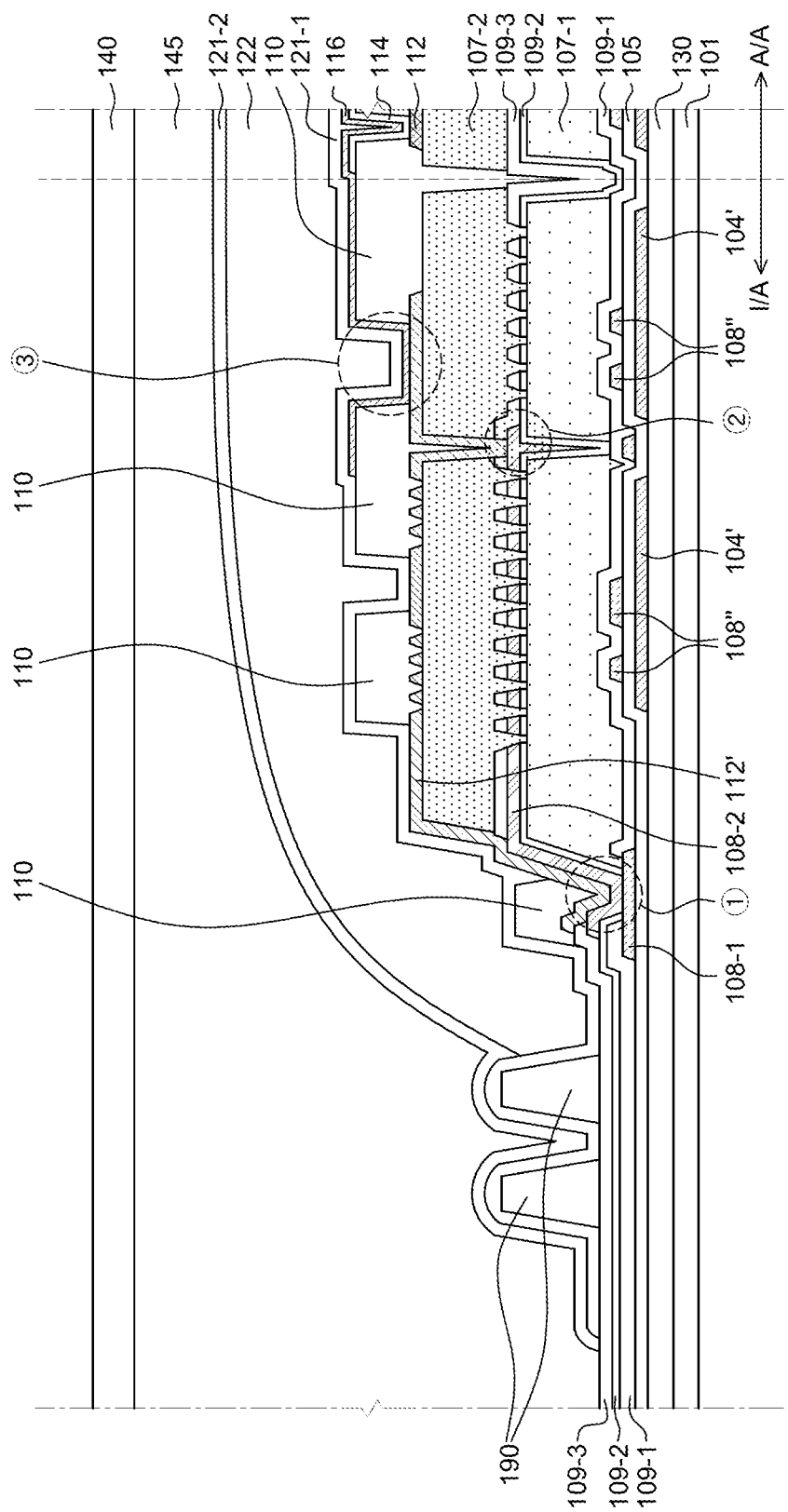
FIG. 5A and FIG. 5B are views illustrating a portion of an inactive area of an organic light emitting display device according to another aspect of the present disclosure.
Figure 5B:
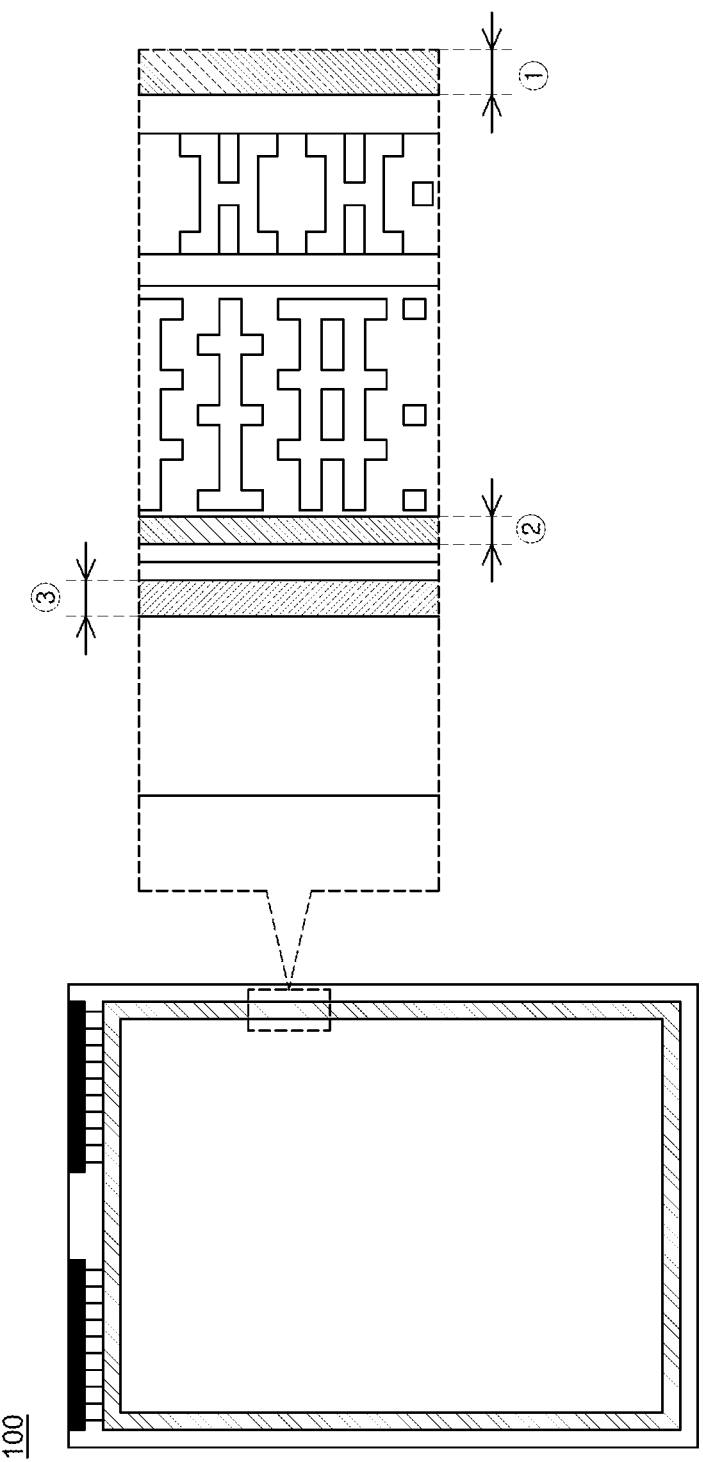

FIG. 5A and FIG. 5B are views illustrating a portion of an inactive area of an organic light emitting display device according to another aspect of the present disclosure.

Referring to FIG. 5A and FIG. 5B, substantially the same elements as illustrated in FIG. 1, FIG. 2 and FIG. 4 are denoted by the same reference numerals, and redundant descriptions thereof will be omitted.

In another aspect as shown in FIGS. 5A and 5B, the first metal layer 108-2 and the second metal layer 112' configure a structure for connecting the power supply line 108-1 and the cathode 116, which is different from the aspect of the disclosure shown in FIG. 4. Referring to FIG. 5A, the power supply line 108-1 may be disposed outside the first planarization layer 107-1 and the first metal layer 108-2 may be in contact with the power supply line 108-1 at the first point (1), outside of the first planarization layer 107-1, and may extend (or cover) the outermost side wall. At this time, the first metal layer 108-2 may extend sufficiently inward to contact the second metal layer 112' at the second point (2). Meanwhile, the first metal layer may have an opening for out-gassing gas generated in the first planarization layer 107-1.

On the other hand, the second metal layer 112' contacts the first metal layer 108-1 and extends inward to contact the cathode 116 at the third point (3). The cathode 116 may receive voltage through a connection with the second metal layer 112'. The second metal layer 112' may also contact the first metal layer 108-1 at the first point. The second metal layer 112' may extend to cover the upper surface of the first metal layer 108-1 and the outermost sidewall of the second planarization layer 107-2 so as to contact with the cathode 116 on the second planarization layer 107-2.

In the above-described second aspect, the second metal layer 112' contacts with the first metal layer 108-2 at two points (1), (2), so that a more stable electrical connection can be ensured. FIG. 5B is a plan view of the organic light emitting display device. In the case of the second aspect, the first point (1) is the point where the power supply line 108-1, the first metal layer 108-2 and the second metal layer 112' contact each other. The second point (2) is a point where the first metal layer 108-2 and the second metal layer 112' contact each other. The third point (3) is a point where the second metal layer 112' and the cathode 116 contact each other.

If the power supply line 108-1 and the first metal layer 108-2 are made of the same material, a conductive path is formed as if the first metal layer 108-2 is connected in parallel to two portions of the second metal layer 112' whereby the overall path resistance can be reduced. Accordingly, such a structure can reduce power supply voltage variations.

Meanwhile, as an alternative aspect, the second metal layer 112' may not be in contact with the first metal layer 108-2 at the first point (1). That is, the second metal layer 112' is not positioned on the sidewall of the second planarization layer 107-2 but formed only on the upper portion of the second planarization layer 107-2, thus, it may be in contact with the first metal layer 108-2 only at the second point (2). This can be applied when the second metal layer 112' is a material having a relatively high resistance. In this case, the conductive path through the second metal layer, which has a relatively high resistance than the first metal layer, is shortened, and thus, the fluctuation of the power supply can be minimized. In case of the alternative aspect, referring to FIG. 5B, the first point (1) is a point where the power supply wiring 108-1 and the first metal layer 108-2 are in contact with each other. The second point (2) is a point where the first metal layer 108-2 and the second metal layer 112' are in contact with each other. The third point (3) is a point where the second metal layer 112' and the cathode 116 are in contact with each other.

The light-emitting display device according to the aspects of the present disclosure can be implemented on a substrate 101 on which an active area A/A in which an image is displayed and an inactive area I/A surrounding the active area are defined. The substrate 101 may be a flexible substrate having flexibility. The power supply line 108-1 and the connection structures 108-2 and 112' may be disposed in the inactive area I/A of the substrate 101. The power supply line may be a line for supplying the ground voltage Vss.

A first planarization layer 107-1 may be formed on a layer where the power supply line 108-1 is formed and a first metal layer 108-2 may be formed on the first planarization layer 107-1 and is in contact with the power supply line 108-1. The second planarization layer 107-2 may flatten (or planarizes) the upper portion of the first metal layer 108-2, a second metal layer 112' is positioned on the second planarization layer, and the second metal layer 112' is in contact with the first metal layer and the cathode of the organic light emitting diode. The first metal layer 108-2 may be made of a material having a resistance lower than that of the second metal layer 112'.

The first metal layer 108-2 may contact the power supply line 108-1 from the outside of the first planarization layer 107-1. Further, the first metal layer 108-2 may cover the sidewall of the first planarization layer 107-1 and may extend toward the active area on the first planarization layer 107-1. At this time, the first metal layer 108-2 is positioned above the circuit portion (e.g., GIP circuit) with the first planarization layer 107-1 therebetween. The first metal layer 108-2 may further extend toward the active area and may contact the second metal layer 112' on the first planarization layer 107-1.

On the other hand, the second metal layer may contact with the first metal layer 108-2 at a point where the first metal layer 108-2 contacts the power supply line 108-1, or may contact with the first metal layer 108-2 on the first planarization layer 107-1 without directly contacting power supply line 108-1.

The aspects of the present disclosure can be described as follows:

A display device (100) comprises a substrate having an active area (A/A) including a matrix of pixels and having an inactive area (I/A) adjacent to the active area; and a dual-layer planarization structure (107-1 and 107-2), having a first planarization layer (107-1) and a second planarization layer (107-2) thereon, over the active area and extending into the inactive area. The inactive area has a first region, adjacent to the active area, in which a Gate-In-Panel (GIP) structure (104') is located, the GIP structure configured to transfer gate signals to the pixels. Also, the inactive area has a second region, adjacent to the first region, in which a power supply line (108-1) is located, the power supply line configured to transfer voltage to the pixels. The first and second regions have an overlapping section that provides a more narrow bezel compared to a conventional bezel in which the first and second regions have no overlap.

The overlapping section is achieved by having the power supply line configured as a two-metal structure, which includes a first metal layer (108-1, 108") patterned under the first planarization layer and includes a second metal layer (108-2) on an end portion of the first planarization layer.

The second metal layer is in contact with the first metal layer at the end portion of the first planarization layer (i.e., contact point 1 in FIGS. 5A-5B) and the second metal layer extends up the end portion and onto a top surface of the first planarization layer, with an end portion of the second planarization layer covering a portion of the second metal layer at the top surface of the first planarization layer.

The display device may further have an anode metal layer (112') that is patterned on the second planarization layer, the anode metal layer having a portion extending over the end portions of the first and second planarization layers onto the second metal layer, the anode metal layer being in contact with the second metal layer via a contact hole through the second planarization layer (i.e., contact point 2 in FIGS. 5A-5B). Also, the display device may further have a cathode (116) above the second planarization layer in the active area and extending into the inactive area, the cathode being in contact with the anode metal layer at the inactive area (i.e., contact point 3 in FIGS. 5A-5B). Also, the display device may further have one or more dams (190) along an edge of the inactive area and spaced apart from the end portions of the first and second planarization layers. Additionally, the display device may further have a particle cover layer (PCL) (122) covering the active area and the inactive area up to the dams. Furthermore, at least one among the second metal layer and the anode metal layer includes outgassing holes (e.g., as shown in FIGS. 4 and 5A).

The aspects of the present disclosure can also be described as follows:

According to an aspect of the present disclosure, an organic light emitting display device may include a substrate including an active area configured to display an image and an inactive area configured to surround the active area, a power supply line in the inactive area, a first planarization layer on a layer where the power supply line is disposed on, a first metal layer on the first planarization layer and in contact with the power supply line, a second planarization layer configured to planarize an upper portion of the first metal layer, and a second metal layer, on the second planarization layer, and in contact with the first metal layer and a cathode of an organic light emitting diode.

The first metal layer may be in contact with the power supply line at an outside of the first planarization layer.

The first metal layer may cover a side wall of the first planarization layer and extends towards to the active area on the first planarization layer.

The first metal layer may be on a circuit unit with the first planarization layer interposed therebetween.

The circuit unis may be a gate in panel (GIP) circuit.

The first metal layer may be in contact with the second metal layer on the first planarization layer.

The second metal layer may be in contact with the first metal layer at a point where the first metal layer contacts the power supply line.

The second metal layer may contact the first metal layer on the first planarization layer without directly contacting the power supply line.

The first metal layer and the second metal layer may include openings formed to exhaust residual gases of the first planarization layer and the second planarization.

The power supply line may be a line for supplying a ground voltage (Vss).

The first metal layer may be made of a material having a lower resistance than the second metal layer.

The substrate may be a flexible substrate.

Although the exemplary aspects of the present disclosure have been described in detail with reference to the accompanying drawings, the present disclosure is not limited thereto and may be embodied in many different forms without departing from the technical concept of the present disclosure. Therefore, the aspects of the present disclosure are provided for illustrative purpose only but not intended to limit the technical concept of the present disclosure. The features of various aspects of the present disclosure can be partially or entirely bonded to or combined with each other and can be interlocked and operated in technically various ways as can be fully understood by a person having ordinary skill in the art and the aspects can be carried out independently of or in association with each other.

The protective scope of the present disclosure should be construed based on the following claims and all the technical concepts in the equivalent scope thereof should be construed as falling within the scope of the present disclosure.

What is claimed is:

1. An organic light emitting display device comprising:
    an active area and an inactive area on a substrate, the active area configured to display an image and an inactive area surrounding the active area;
    a power supply line in the inactive area;
    a first planarization layer on a layer where the power supply line is disposed;
    a first metal layer on the first planarization layer to cover an outermost sidewall of the first planarization layer and in contact with the power supply line;
    a second planarization layer planarizing an upper portion of the first metal layer;
    an organic light emitting diode on the second planarization layer;
    a second metal layer on the second planarization layer to cover an outermost sidewall of the second planarization layer and the upper surface of the first metal layer covering the outermost sidewall of the first planarization layer, and in contact with the first metal layer and a cathode of the organic light emitting diode; and a bank on the second planarization layer and on the second metal layer, and wherein the cathode is disposed on the bank and in contact with the second metal layer via a contact hole formed in the bank.

2. The organic light emitting display device of claim 1, wherein the first metal layer is in contact with the power supply line outside the first planarization layer.

3. The organic light emitting display device of claim 2, wherein the first metal layer covers a side wall of the first planarization layer and extends towards to the active area on the first planarization layer.

4. The organic light emitting display device of claim 3, wherein the first metal layer is disposed on a circuit unit with the first planarization layer interposed therebetween.

5. The organic light emitting display device of claim 4, wherein the circuit unit includes a gate in panel (GIP) circuit.

6. The organic light emitting display device of claim 3, wherein the first metal layer is in contact with the second metal layer on the first planarization layer.

7. The organic light emitting display device of claim 3, wherein the second metal layer is in contact with the first metal layer at a point where the first metal layer contacts the power supply line.

8. The organic light emitting display device of claim 2, wherein the second metal layer contacts the first metal layer on the first planarization layer without contacting the power supply line.

9. The organic light emitting display device of claim 1, wherein the first metal layer and the second metal layer include one or more openings to exhaust residual gases from the first planarization layer and the second planarization layer.

10. The organic light emitting display device of claim 1, wherein the power supply line is a line for supplying a ground voltage.

11. The organic light emitting display device of claim 1, wherein the first metal layer is made of a material having a lower resistance than the second metal layer.

12. The organic light emitting display device of claim 1, wherein the substrate includes a flexible substrate.

* * * * *